(12) United States Patent
Kim

(10) Patent No.: US 10,330,737 B2
(45) Date of Patent: Jun. 25, 2019

(54) APPARATUS AND METHOD FOR CALCULATING DEGRADATION DEGREE

(71) Applicant: Hyundai Motor Company, Seoul (KR)

(72) Inventor: Woo-Sung Kim, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 249 days.

(21) Appl. No.: 14/927,058

(22) Filed: Oct. 29, 2015

(65) Prior Publication Data

US 2016/0299197 A1   Oct. 13, 2016

(30) Foreign Application Priority Data

Apr. 8, 2015 (KR) .................. 10-2015-0049551

(51) Int. Cl.
| | | |
|---|---|---|
| *G01R 31/392* | (2019.01) | |
| *G01R 31/367* | (2019.01) | |
| *B60L 58/10* | (2019.01) | |
| *G01R 31/371* | (2019.01) | |

(52) U.S. Cl.
CPC ............ *G01R 31/392* (2019.01); *B60L 58/10* (2019.02); *G01R 31/367* (2019.01); *G01R 31/371* (2019.01)

(58) Field of Classification Search
CPC .................. G01R 31/3679; B60L 11/1851
USPC .......................................................... 702/63
See application file for complete search history.

(56) References Cited

U.S. PATENT DOCUMENTS

| | | | | |
|---|---|---|---|---|
| 5,650,712 A | * | 7/1997 | Kawai | G01R 31/361 320/DIG. 21 |
| 8,055,462 B1 | * | 11/2011 | Benckenstein, Jr. | G01R 31/3606 320/132 |
| 2012/0139491 A1 | * | 6/2012 | Eberhard | H02J 7/0016 320/118 |
| 2013/0138373 A1 | * | 5/2013 | Lee | G01R 31/3613 702/65 |
| 2015/0046107 A1 | * | 2/2015 | Jo | G01R 31/3606 702/63 |
| 2015/0160304 A1 | * | 6/2015 | Nam | G01R 31/3679 702/63 |

FOREIGN PATENT DOCUMENTS

| | | |
|---|---|---|
| JP | 2006-98135 | 4/2006 |
| JP | 2012-181037 | 9/2012 |
| JP | 2013-44598 | 3/2013 |
| KR | 10-2011-0084633 A | 7/2011 |
| KR | 10-2013-0089360 A | 8/2013 |

(Continued)

*Primary Examiner* — Huan Hoang
*Assistant Examiner* — Muna A Techane
(74) *Attorney, Agent, or Firm* — Mintz Levin Cohn Ferris Glovsky and Popeo, P.C.; Peter F. Corless

(57) ABSTRACT

An apparatus for calculating a degradation degree is provided and includes a battery and a measurer that senses the battery to generate behavior information. The apparatus further includes a calculator that divides the behavior information into a plurality of sections and calculates a behavior change quantity in each section and/or charging capacity in each section of the behavior information in each section. The calculator uses the behavior change quantity in each section and the charging capacity in each section to determine the degradation degrees of the battery in each section, and use the degradation degrees of the battery within each section to generate a final degradation degree of the battery.

16 Claims, 7 Drawing Sheets

(56) References Cited

FOREIGN PATENT DOCUMENTS

| KR | 10-1399388 | B1 | 5/2014 |
| KR | 10-1460248 | | 11/2014 |
| KR | 10-1498761 | B1 | 3/2015 |

\* cited by examiner

APPARATUS AND METHOD FOR CALCULATING DEGRADATION DEGREE

CROSS-REFERENCE(S) TO RELATED APPLICATIONS

This application claims priority to Korean Patent Application No. 10-2015-0049551 filed on Apr. 8, 2015, which is incorporated herein by reference in its entirety.

BACKGROUND

Field of the Invention

The present invention relates to a battery management technology, and more particularly, to an apparatus and a method for calculating a degradation degree by measuring a change rate of voltage of a battery.

Description of Related Art

Generally, vehicle mileage is affected by a capacity and/or a state of a battery. However, when the battery is continuously used, the capacity of the battery degrades. When the degradation of the battery occurs, even though the same state of charge (SOC) is displayed, mileage reduction and power reduction for acceleration occur.

The determination regarding the extent of degradation of the battery is based on a method for measuring internal resistance. For example, a battery is connected to an apparatus for measuring internal resistance or a method for measuring internal resistance using an apparatus for measuring internal resistance. Conversely, the determination regarding the extent of degradation of the battery is based on a method for determining a degradation state of a battery in response to an increased degree of internal resistance by estimating the internal resistance based on a modeling analysis on a voltage output of a battery to an input current thereof.

However, it is difficult to separate the battery when measuring the internal resistance of the battery when the battery mounted within the vehicle. Further, the increase in the internal resistance of the battery occurs due to the degradation in capacity and the degradation in power, and therefore, the determination on the internal resistance of the battery may be inappropriate to determine degradation in capacity in eco-friendly vehicles. An example of the eco-friendly vehicles may include an electric vehicle (EV), a plug-in hybrid electric vehicle (PHEV), etc.

Further, the degradation of a battery under the condition which the battery is specialized for eco-friendly vehicles is measured when the battery is charged with a constant current and includes a feature that reduces the charging capacity of a specific voltage region. However, the calculation is limited since the calculation is made in a specific temperature region. In other words, a calculation condition having a slow charging region which is constant low current charging and a voltage detection region are wide and the calculation condition does not reflect voltage characteristics based on temperature change. Further, the method compares current integrated quantities in the specific voltage region and therefore the calculation accuracy may sensitively react to an error of a sensor which occurs during the current integration.

SUMMARY

The present invention provides an apparatus and a method for calculating a degradation degree of a battery by reflecting a change quantity of voltage to current and/or voltage characteristics based on temperature. Additionally, the present invention provides, an apparatus for calculating a degradation degree of a battery that represents a voltage change quantity to current and/or voltage characteristics based on temperature.

In an exemplary embodiment, the apparatus for calculating a degradation degree may include a battery; a measurer configured to sense the battery to generate behavior information; and a calculator configured to divide the behavior information into a plurality of sections, and calculates a behavior change quantity in each section and/or charging capacity in each section of the behavior information in each section. The behavior change quantity in each section and the charging capacity in each section may be used to calculate the degradation degrees of the battery in each section. The degradation degrees of the battery in each section may be used to calculate the battery's final degradation degree.

In some exemplary embodiments, the behavior information may include a voltage, a current, and a temperature of the battery. The calculator may include a behavior change calculator configured to determine an initial voltage reference section among the plurality of sections based on confirmation of a preset temperature condition. The initial voltage reference section may be used to calculate a voltage change quantity to the current in each section. Furthermore, a battery degradation calculator may configured to calculate the charging capacity in each section that corresponds to a voltage change rate in each section to calculate the degradation degree of the battery in each section.

The charging capacity in each section may be determined using an initially measured charging capacity. The initial charging capacity may be adjusted based on a mileage of a vehicle. The degradation degree of the battery in each section may be determined by dividing the charging capacity in the corresponding section by the initial charging capacity. The degradation degree of the battery in each section may be determined using a section in which the calculation is made among the plurality of sections. The final degradation degree may be determined based on an average value of the degradation degrees of the battery in each section.

In other exemplary embodiments, the apparatus may further include an output unit configured to generate the final degradation degree as a combination of characters, voices, and graphics. The plurality of sections may be formed by dividing the behavior information based on a point where non-linear characteristics are generated. The behavior change quantity in each section may be a value obtained by converting a voltage in each section into a value for current.

In accordance with another exemplary embodiment, a method for calculating a degradation degree may include sensing, by a sensor, a battery to generate behavior information; calculating, by a calculator, degradation degrees of the battery in each section by dividing the behavior information into a plurality of sections, calculating a behavior change quantity in each section and/or charging capacity in each section of the behavior information in may be calculated. The behavior change quantity in each section and the charging capacity in each section may be used and calculating, by the calculator a final degradation degree of the battery by using the degradation degrees of the battery in the plurality of sections.

In some exemplary embodiments, the calculation of the degradation degrees in each section may include, calculating a voltage change quantity to the current in each section by determining an initial voltage reference section among the plurality of sections based on a confirmation of a preset temperature condition and using the initial voltage reference section. The degradation degree of the battery in each section may be determined by calculating the charging capacity in each section corresponding to a voltage change rate in each section. The method may further include outputting the final degradation degree to an output unit as a combination of characters, voices, and graphics.

BRIEF DESCRIPTION OF THE DRAWINGS

The above and other features of the present disclosure will be apparent from the following detailed description when taken in conjunction with the accompanying drawings, in which.

DETAILED DESCRIPTION

Figure 1:
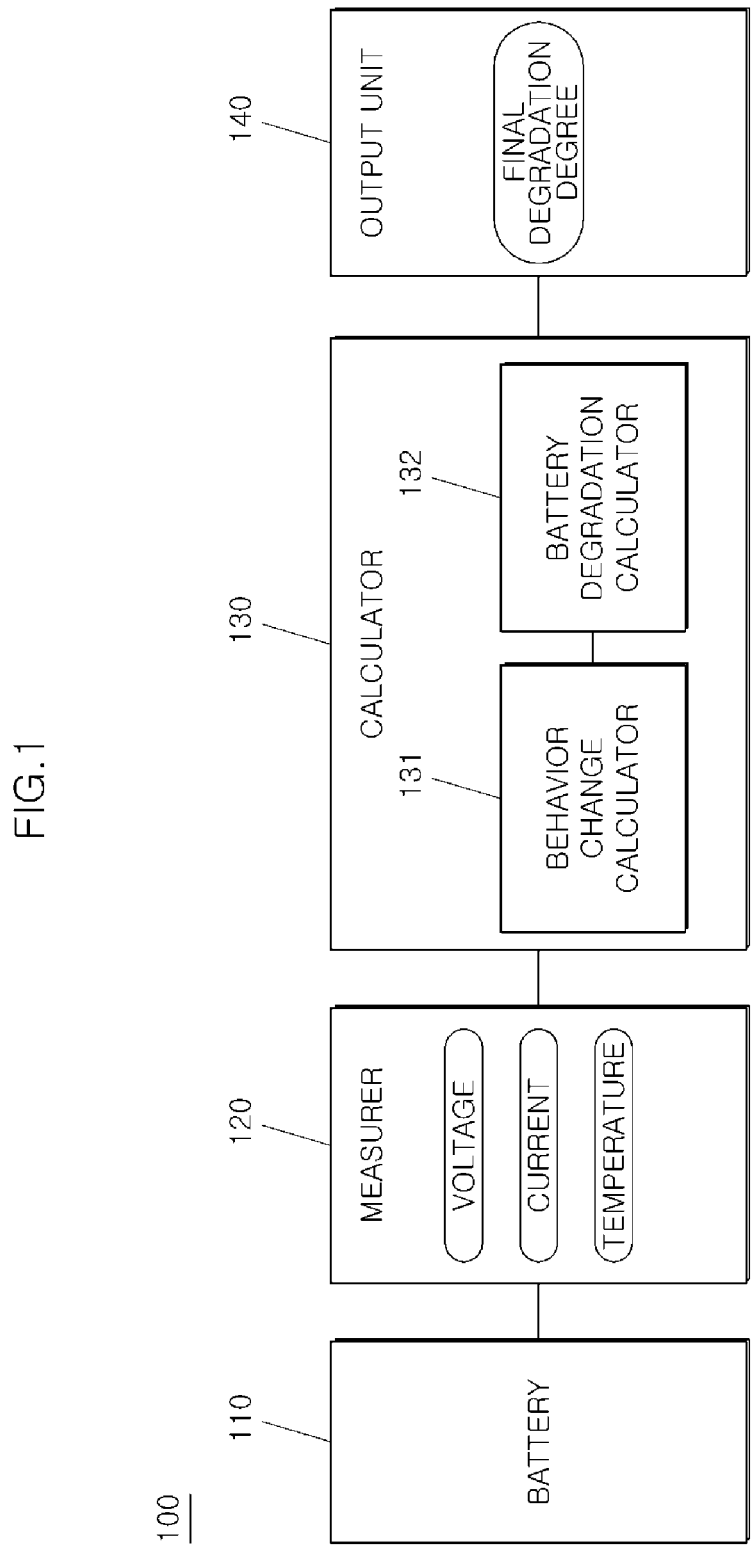
FIG. 1 is an exemplary block diagram of an apparatus for calculating a degradation degree according to an exemplary embodiment of the present invention.

Advantages and features of the invention and methods of accomplishing the same may be understood more readily by reference to the following detailed descriptions of exemplary embodiments and the accompanying drawings. While the invention will be described in conjunction with exemplary embodiments, it will be understood that present description is not intended to limit the invention to those exemplary embodiments. However, it is to be understood that the invention is intended to cover not only the exemplary embodiments but also various modifications, equivalents, and substitutions included in the spirit and the scope of the invention as defined by the appended claims.

Throughout the accompanying drawings, the same reference numerals will be used to describe the same components. Terms used in the specification, 'first', 'second', etc., may be used to describe various components, but the components are not to be construed as being limited to the terms. The terms are used to distinguish one component from another component. For example, the 'first' component may be named the 'second' component, and vice versa, without departing from the scope of the present invention. The term 'and/or' includes a combination of a plurality of items or any one of a plurality of terms.

Unless indicated otherwise, it is to be understood that all the terms used in the specification including technical and scientific terms has the same meaning as those that are understood by those who skilled in the art. It must be understood that the terms defined by the dictionary are identical with the meanings within the context of the related art, and they should not be ideally or excessively formally defined unless the context clearly dictates otherwise. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although an exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

FIG. 1 illustrates an exemplary block diagram of an apparatus 100 for calculating a degradation degree according to an exemplary embodiment. Referring to FIG. 1, the apparatus 100 for calculating a degradation degree may include a measurer 120 configured to measure a battery 110 to generate behavior information and a calculator 130 that uses the behavior information to determine degradation degrees in the plurality of sections. The degradation degrees may be used to calculate a final degradation degree of the battery 110 and an output unit 140 may be configured to output the final degradation degree, etc.

The battery 110 may include a plurality of battery cells (not illustrated) connected in series and/or in parallel. Further, the battery cell may be a high voltage battery for an eco-friendly vehicle such as a nickel metal battery and a lithium ion battery. Generally, the high voltage battery (e.g., about 100 V or greater) may be used as a power source to initiate movement of the eco-friendly vehicle. However, the exemplary embodiment is not limited thereto, and therefore a low voltage battery may be used. Herein, an example of the eco-friendly vehicle may include an electric vehicle (EV), a hybrid electric vehicle (HEV), a plug-in hybrid electric vehicle (PHEV), a fuel cell vehicle, and the like.

The measurer 120 (e.g., a sensor) may be configured to sense the behavior of the battery 110 to generate the behavior information. An example of the behavior information may include voltage, current, temperature, etc. Therefore, the measurer 120 may include a voltage sensor, a current sensor, a temperature sensor, etc., to sense the voltage, the current, the temperature, etc. The calculator 130 may be configured to divide the behavior information into a plurality of sections and may determine a behavior change quantity in each section and/or charging capacity in each section of the behavior information in each section. Further, the calculator may use the behavior change quantity in each section and the charging capacity in each section to determine the degradation degrees of the battery in each section.

Furthermore, the calculator 130 may include the behavior change calculator 131 configured to calculate the behavior change quantity and the charging capacity in each section. The battery degradation calculator 132 may determine the degradation degrees of the battery in each section, etc. The behavior change calculator 131 may be configured to determine an initial voltage reference section among the plurality of sections based on a confirmation of a preset temperature condition. Additionally, the initial voltage reference section may be used to determine the voltage change quantity to the current in each section. Further, the battery degradation calculator 132 may be configured to determine the charging capacity in each section that corresponds to the voltage change rate in each section to calculate the degradation degrees of the battery in each section. The output unit 140 may be configured to output (e.g., produce or generate) the final degradation as a combination of characters, voices, and graphics. In other words, a display system, an audio system, etc., may be configured.

Figure 2:
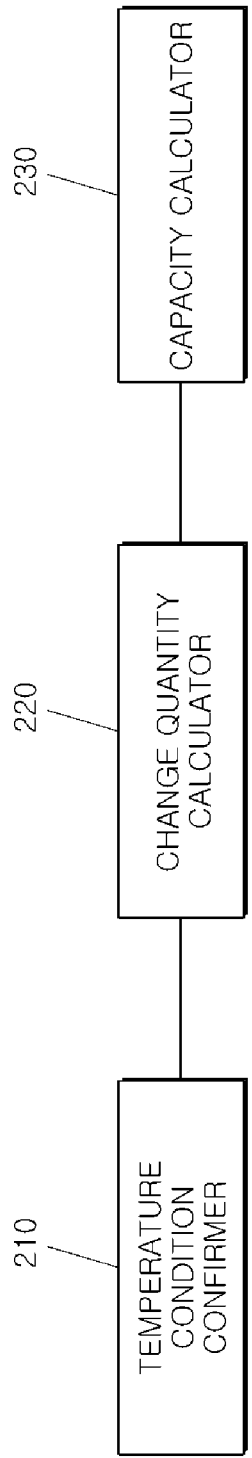
FIG. 2 is an exemplary block diagram of a behavior change calculator illustrated in FIG. 1.

FIG. 2 is an exemplary block diagram of the behavior change calculator 131 illustrated in FIG. 1. Referring to FIG. 2, the behavior change calculator 131 may include a temperature condition confirmer 210, and a change quantity calculator 220 configured to adjust the behavior change quantities in the plurality of sections of the behavior information. The behavior change calculator 131 may include a capacity calculator 230 configured to determine the charging capacity in the plurality of sections based on the behavior change quantity in the plurality of sections, etc.

In particular, the temperature condition confirmer 210 may use a measured temperature of the battery 110 (FIG. 1) to confirm whether the measured temperature corresponds to the preset temperature condition. In other words, when the measured temperature of the battery 110 corresponds to a preset temperature condition (e.g., about 20° C. to 30° C.), the behavior information such as voltage and current may be selected and the information that corresponds to the temperature may be discarded. The change quantity calculator 220 may be configured to calculate a voltage change quantity to current ($\Delta V/I$) among the behavior information. In other words, when calculating the degradation degree of the battery 110, the voltage change quantity to the current may be determined from the voltage behavior when charging of the battery. The capacity calculator 230 may determine the charging capacity Ahn of the battery 110 within the section of the constant voltage change quantity ($\Delta V/I$). In other words, when each section converts the voltage into a value (e.g., resistance characteristics) the current may determine the correlation with the charging capacity within the calculation for each section.

Figure 3:
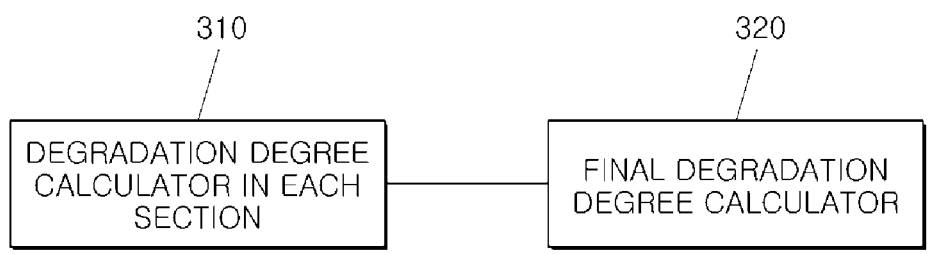
FIG. 3 is an exemplary block diagram of a battery degradation calculator illustrated in FIG. 1.

FIG. 3 is an exemplary block diagram of the battery degradation calculator 132 illustrated in FIG. 1. Referring to FIG. 3, the battery degradation calculator 132 may include a degradation degree calculator in each section 310, and a final degradation degree calculator 320, etc. The degradation degree calculator in each section 310 may be configured to divide the current charging capacity based on the substainally constant voltage change quantity ($\Delta V/I$) by initial charging capacity to determine the degradation of the battery in the corresponding section. This will be represented by the following Equation 1.

$$\text{Degradation degrees } (n) \text{ in each section} = Ahn/Ahn\text{ini.} \qquad \text{Equation 1}$$

Wherein, the Ahn represents the current charging capacity in each section and the Ahnini represents the initial charging capacity.

Figure 5:
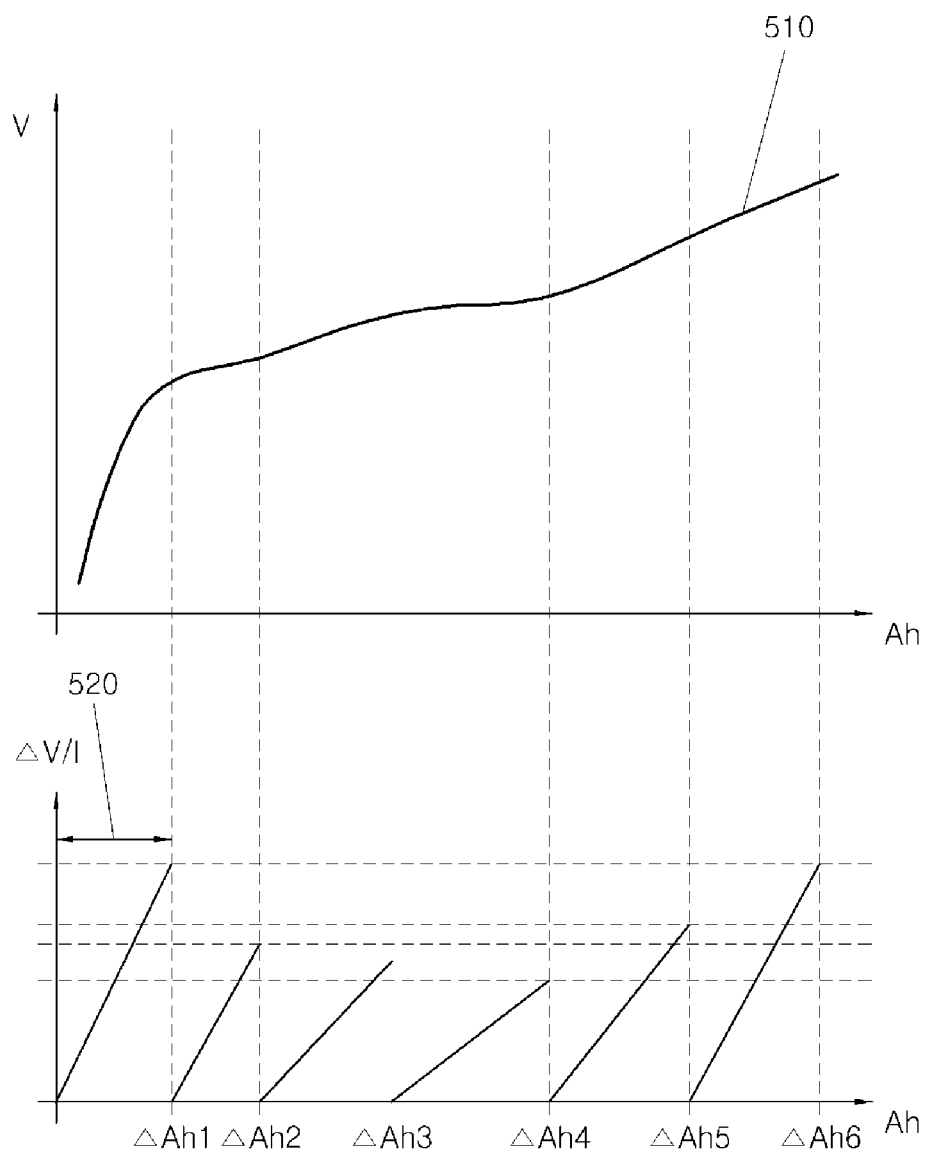
FIG. 5 is an exemplary graph showing a general battery voltage behavior at the time of charging according to an exemplary embodiment of the present invention.
Figure 6:
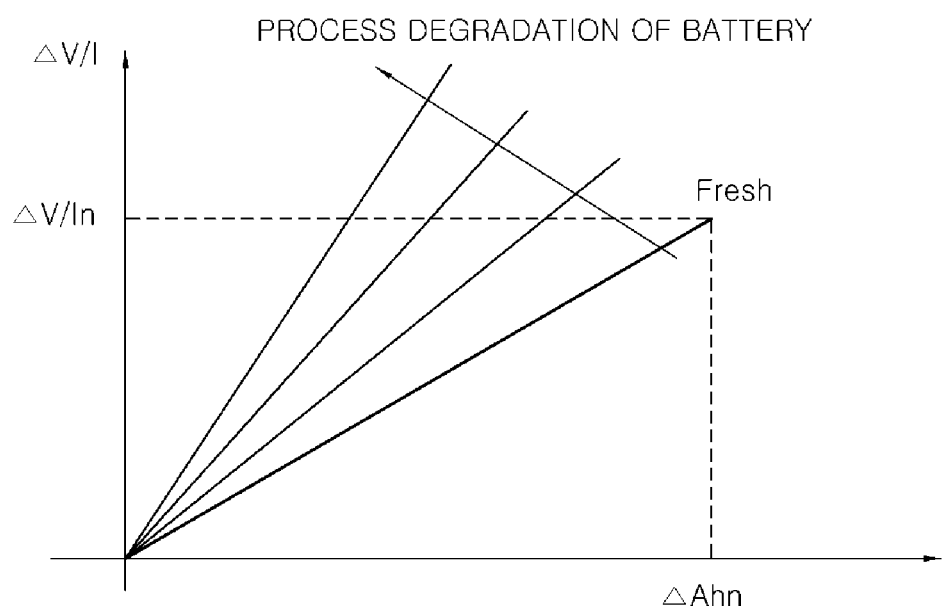
FIG. 6 is an exemplary graph illustrating a behavior of a voltage change quantity to current based on a degradation of the battery in a specific section according to the exemplary embodiment of the present invention.
Figure 7:
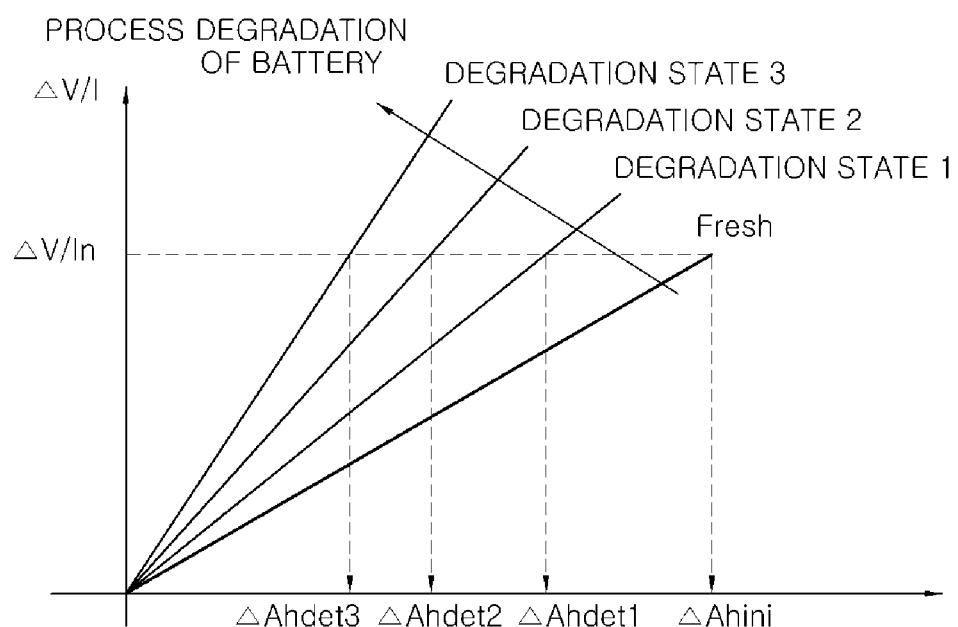
FIG. 7 is an exemplary graph diagram illustrating a capacity change based on the voltage change quantity to constant current based on the degradation of the battery according to the exemplary embodiment of the present invention.

In Equation 1, the charging capacity in each section may be determined by using the initially measured charging capacity. FIGS. 5 to 7 are exemplary graph diagrams illustrating a concept of calculating degradation degrees in the plurality of sections, which will be described below.

Referring to FIG. 3, when the final degradation degree calculator 320 determines the degradation degrees of the battery in each of the sections which are divided (e.g., separated) the final degradation degree of the battery 110 may be obtained averaging the value of all the sections. This will be represented by the following Equation 2.

$$\text{Final degradation degree} = (\Sigma \text{ degradation degrees in each of the sections } (n))/n. \qquad \text{Equation 2}$$

When the final degradation degree is determined, the initial charging state may be adjusted based on the mileage of the vehicle and therefore there calculation of each of the sections is not required at all times. Therefore, the section battery degradation degree may be determined in the section in which the calculation may be performed and the average value of the calculated sections is obtained. Additionally, the entry frequency for the calculation of the degradation degree may be improved.

Further, when determining the average value of all the sections, the calculation error in degradation degrees in each section may vary, and therefore the calculation error of each section based on the degradation degree may be obtained. When the final degradation degree of the battery is based on the calculation error, the average value of the sections may be used to minimize the calculation error. Alternately, the calculation of the simple average value which has a particular rate set based on the error accuracy in the section may be used to minimize the calculation error.

Figure 4:
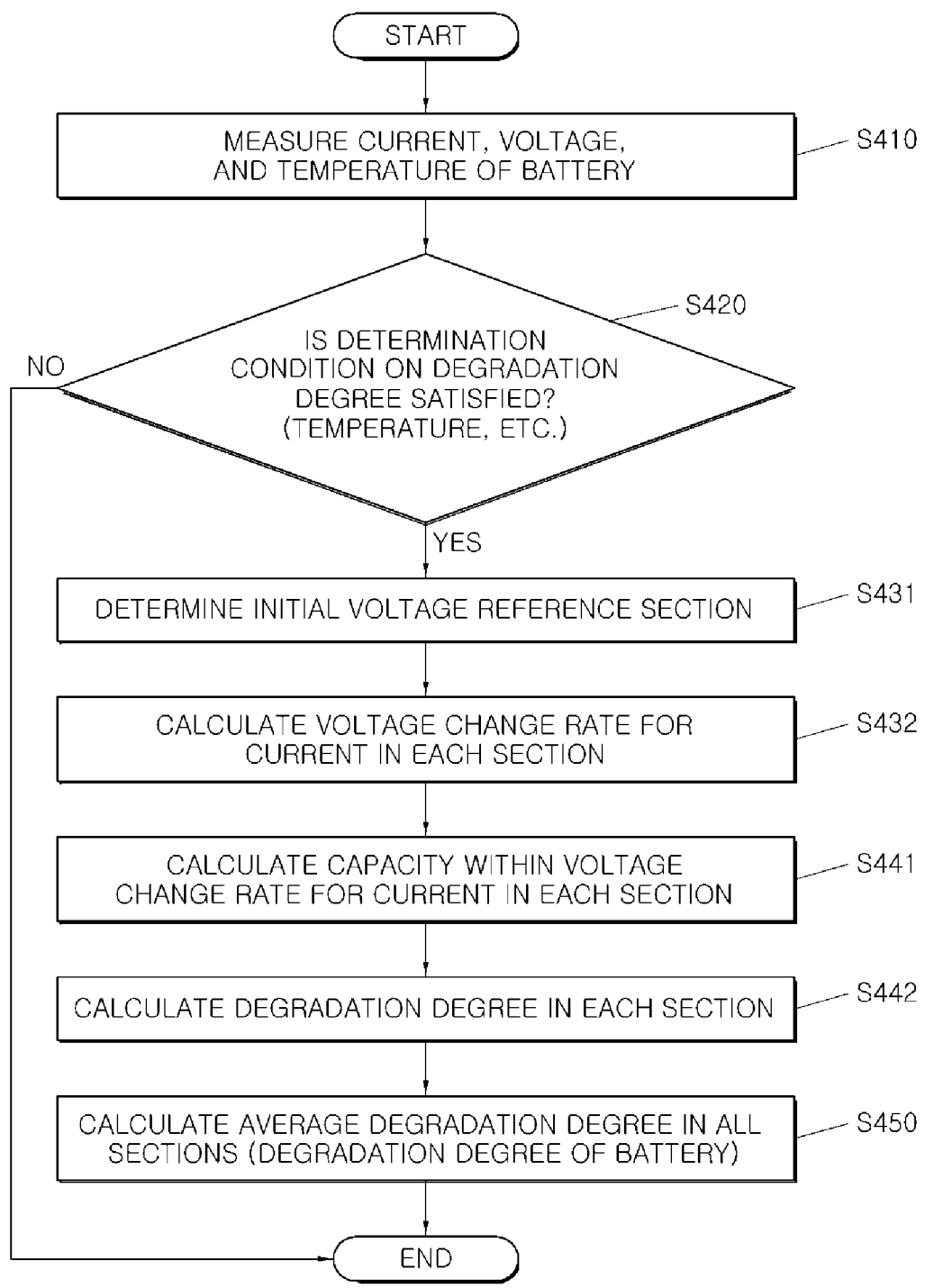
FIG. 4 is an exemplary flow chart illustrating a process of calculating a degradation degree according to an exemplary embodiment of the present invention.

FIG. 4 is an exemplary flow chart illustrating a process of calculating a degradation degree according to an exemplary embodiment of the present invention. Referring to FIG. 4, the measurer 120 (FIG. 1) may be configured to sense the battery 110 (FIG. 1) and generate the behavior information (current, voltage, temperature, etc.) S410. When the behavior information is generated, the measurer 120 may be configured to determine whether the measured temperature among the behavior information satisfies a preset temperature condition S420. In other words, when the preset temperature condition is set to about 20° C. to 30° C., is the measurer determines whether the measured temperature satisfies the condition.

When the measured temperature does not satisfy the preset temperature condition, the degradation degree may not be determined. In other words, when the measured temperature is about 35°, the measured temperature exceed the temperature condition, and calculate calculation of the degradation degree is not required. Conversely, when the measured temperature S420 satisfies the preset temperature condition, an initial voltage reference section among a plurality of sections may be determined S431. Next, the voltage change quantity to current in each section may be determined using the initial voltage reference section S432.

When the voltage change quantity to current in each section is determined, the charging capacity in each section corresponding to the voltage change rate in each section may be determined and the degradation degree of the battery in each section may be determined S441 and S442. When the degradation degrees of the battery in each section are calculated, an average degradation degree in all the sections may be calculated to determine the final degradation degree S450.

FIG. 5 is an exemplary graph illustrating battery voltage behavior at the time of charging. Referring to FIG. 5, the eco-friendly vehicle may use the battery charged with a substantially constant current (e.g., power) and therefore the degradation state of the battery may be determined using the voltage change characteristics of the battery. As illustrated in the upper portion of the graph of FIG. 5, a voltage behavior 510 may be adjusted based on the charging capacity when charging the battery.

For example, the voltage (V) of the battery based on the charging quantity Ah may moves in a non-linear form within each charging section, not in a linear characteristic of a constant rate. In particular, the correlation between the capacity change and the voltage change (to current) in the plurality of sections 520 may be represented by dividing the section in which the voltage change rate are adjusted as represented within the lower portion of the graph of FIG. 5. Referring to FIG. 5, as the degradation of the battery proceeds, the voltage change (e.g., resistance) to current may be increased. The voltage change to current may occur in each section 520 of FIG. 5. For example, the increase in voltage may be based on the same capacity however, the charging capacity may be reduced. Therefore, the section of the voltage behavior during the charging of the battery may be divided based on a point (e.g., point of inflection) at which the voltage change occurs.

FIG. 6 is exemplary graph illustrating the behavior of the voltage change quantity to current based on a degradation of the battery in a specific section according to the exemplary embodiment of the present invention. Referring to FIG. 6, the voltage in each section may be converted into a value (e.g., resistance characteristics) for current to obtain the correlation between the voltage change quantity to current $\Delta V/I$ in each section and the charging capacity $\Delta Ah$. For example, the correlation between the section capacity and the voltage change quantity to current may be obtained by a characteristics test of the condition of the degradation of the battery. In particular the acquired degradation characteristics of the battery may be represented by one section as shown in FIG. 6.

FIG. 7 is an exemplary graph illustrating the capacity change based on the voltage change quantity to constant current based on the degradation of the battery according to the exemplary embodiment of the present invention. In particular, FIG. 7 illustrates the relationship between the initially measured charging capacity $\Delta Ah_{ini}$ and the voltage change quantity to current ($\Delta V/I$). Referring to FIG. 7, as the degradation progresses, the charging capacity may be reduced, by calculating the charging capacity in the degradation state based on the voltage change quantity to constant current ($\Delta V/I_n$).

Therefore, the degradation degree of the battery in the corresponding section may be determined by dividing the charging capacity of the voltage change quantity to constant current ($\Delta V/I_n$) by the initial capacity $Ah_n$. As described above, when the degradation degrees of the battery in each section are divided, the degradation degree of the battery may be obtained by taking the average value of all the sections.

According to the exemplary embodiments, the calculation entry frequency of the degradation degree may be increased by dividing the voltage section into multiple sections. Further, the calculation reliability and/or accuracy of the degradation degree may be secured by increasing the calculation frequency. Additionally, the method for calculating a degradation degree using the change quantity of voltage to the current independent of the charging form (low current or large current charging/slow charging or quick charging) may be applied.

Although the present invention was described in connection with what is presently considered to be exemplary embodiments thereof. Accordingly, the present invention is not limited to the foregoing exemplary embodiments and the accompanying drawings, and therefore, a scope of the present invention is not limited to the foregoing exemplary embodiments. However, it will be apparent to those skilled in the art that exemplary embodiments may include substitutions, modifications and variations in various ways that can be made without departing from the spirit and scope of the invention as defined by the appended claims and can also belong to the scope of the present invention.

What is claimed is:

1. An apparatus for calculating a degradation degree of a battery, comprising:
   a measurer configured to generate behavior information in a plurality of sections of the battery, wherein the behavior information includes a voltage, a current, and a temperature of each section of the battery;
   a calculator configured to divide the behavior information measured in the plurality of sections by dividing the behavior information based on a point where non-linear characteristics are generated, calculate a behavior change quantity in each section and charging capacity in each section of the behavior information in each section, use the behavior change quantity in each section and the charging capacity in each section to calculate the degradation degrees of the battery in each section, and use the degradation degrees of the battery in each section to calculate a final degradation degree of the battery, wherein the degradation degrees are calculated through a change in the charging capacity corresponding to a change in the voltage in each section while the current remains constant; and an output unit configured to output the final degradation degree to a display system or an audio system, and adjust an initial charging state based on a mileage of a vehicle.

2. The apparatus of claim 1, wherein the calculator includes:
a behavior change calculator configured to determine an initial voltage reference section among the plurality of sections based on a confirmation of a preset temperature condition and calculates a voltage change quantity to the current in each section based on the initial voltage reference section; and
a battery degradation calculator configured to calculate the charging capacity in each section corresponding to a voltage change rate in each section to calculate the degradation degree of the battery in each section.

3. The apparatus of claim 2, wherein the charging capacity in each section is calculated using an initially measured charging capacity.

4. The apparatus of claim 3, wherein the initial charging capacity is adjusted based on the mileage of the vehicle.

5. The apparatus of claim 3, wherein the degradation degree of the battery in each section is calculated by dividing the charging capacity in the corresponding section by the initial charging capacity.

6. The apparatus of claim 1, wherein the degradation degree of the battery in each section is calculated using a section in which the calculation is made among the plurality of sections and the final degradation degree is based on an average value of the degradation degrees of the battery in each section.

7. The apparatus of claim 1, further comprising:
an output unit configured to output the final degradation degree as a combination of characters, voices, and graphics.

8. The apparatus of claim 1, wherein the behavior change quantity in each section is a value obtained by converting a voltage in each section into a current value.

9. A method for calculating a degradation degree of a battery, comprising:
generating, by a measurer, behavior information in a plurality of sections of the battery, wherein the behavior information includes a voltage, a current, and a temperature of each section of the battery;
determining, by a calculator, degradation degrees of the battery in each section by dividing the behavior information measured in the plurality of sections by dividing the behavior information based on a point where non-linear characteristics are generated, calculating by a behavior change quantity in each section and charging capacity in each section of the behavior information in each section, and using the behavior change quantity in each section and the charging capacity in each section, wherein the degradation degrees are calculated through a change in the charging capacity corresponding to a change in the voltage in each section while the current remains constant;
calculating, by the calculator, a final degradation degree of the battery by using the degradation degrees of the battery in each section;
outputting, by an output unit, the final degradation degree to a display system or an audio system, and adjust an initial charging state based on a mileage of a vehicle.

10. The method of claim 9, wherein the calculation of the degradation degree in each section includes:
calculating, by a voltage change quantity to the current in each section by determining an initial voltage reference section among the plurality of sections based on a confirmation of a preset temperature condition and using the initial voltage reference section; and
calculating, by the degradation degree of the battery in each section by calculating the charging capacity in each section that corresponds to a voltage adjustment rate in each section.

11. The method of claim 10, wherein the charging capacity in each section is calculated using initially measured charging capacity.

12. The method of claim 11, wherein the initial charging capacity is adjusted based on the mileage of the vehicle.

13. The method of claim 11, wherein the degradation degree of the battery in each section is calculated by dividing the charging capacity in the corresponding section by the initial charging capacity.

14. The method of claim 9, wherein the degradation degree of the battery in each section is calculated using a section in which the calculation is made among the plurality of sections and the final degradation degree is determined based on an average value of the degradation degrees of the battery in the plurality of sections.

15. The method of claim 9, further comprising:
outputting, by the final degradation degree to an output unit as a combination of characters, voices, and graphics.

16. The method of claim 9, wherein the behavior change quantity in each section is a value obtained by converting a voltage in each section into a value for current.

* * * * *